(12) United States Patent
Eberler et al.

(10) Patent No.: US 11,131,730 B2
(45) Date of Patent: Sep. 28, 2021

(54) TUNABLE MAGNETIC RESONANCE COIL

(71) Applicant: Siemens Healthcare GmbH, Erlangen (DE)

(72) Inventors: Ludwig Eberler, Neumarkt i.d.OPf. (DE); Razvan Lazar, Erlangen (DE); Volker Matschl, Bamberg (DE); Jürgen Nistler, Erlangen (DE); Martin Schramm, Eckental (DE)

(73) Assignee: Siemens Healthcare GmbH, Erlangen (DE)

( * ) Notice: Subject to any disclaimer, the term of this patent is extended or adjusted under 35 U.S.C. 154(b) by 117 days.

(21) Appl. No.: 16/130,967

(22) Filed: Sep. 13, 2018

(65) Prior Publication Data

US 2019/0079153 A1    Mar. 14, 2019

(30) Foreign Application Priority Data

Sep. 14, 2017    (DE) .......................... 102017216307.0

(51) Int. Cl.
*G01R 33/34* (2006.01)
*G01R 33/36* (2006.01)

(52) U.S. Cl.
CPC . *G01R 33/34092* (2013.01); *G01R 33/34007* (2013.01); *G01R 33/34076* (2013.01); *G01R 33/3628* (2013.01); *G01R 33/3642* (2013.01)

(58) Field of Classification Search
CPC .......... G01R 33/3628; G01R 33/34076; G01R 33/34046; G01R 33/34092; G01R 33/340007; G01R 33/3642
See application file for complete search history.

(56) References Cited

U.S. PATENT DOCUMENTS

| | | | |
|---|---|---|---|
| 4,736,161 A * | 4/1988 | Prevot | G01R 33/3453 324/313 |
| 5,990,681 A | 11/1999 | Richard | |
| 6,011,395 A | 1/2000 | Leifer et al. | |
| 8,680,863 B1 | 3/2014 | Qian | |
| 9,459,331 B2 * | 10/2016 | Otake | G01R 33/365 |
| 9,638,771 B2 * | 5/2017 | Soutome | G01R 33/3678 |
| 9,684,046 B2 | 6/2017 | Grodzki | |
| 2006/0033497 A1 | 2/2006 | Chmielewski | |
| 2007/0120629 A1 | 5/2007 | Schnell | |
| 2008/0094063 A1 | 4/2008 | Renz | |
| 2008/0315880 A1 * | 12/2008 | Habara | G01R 33/34076 324/318 |
| 2010/0102817 A1 | 4/2010 | Saha | |
| 2010/0277175 A1 | 11/2010 | Weiss | |

(Continued)

FOREIGN PATENT DOCUMENTS

| CN | 1717591 A | 1/2006 |
|---|---|---|
| CN | 1975455 A | 6/2007 |

(Continued)

OTHER PUBLICATIONS

German Office Action for German Application No. 102017216307.0, dated May 16, 2018.

(Continued)

*Primary Examiner* — Alesa Allgood
(74) *Attorney, Agent, or Firm* — Lempia Summerfield Katz LLC

(57) ABSTRACT

A magnetic resonance coil having at least one tuning device for tuning the magnetic resonance coil, a magnetic resonance device, and a method for tuning a magnetic resonance coil are provided. The at least one tuning device includes a plurality of capacitors that are mechanically interlinked.

25 Claims, 5 Drawing Sheets

(56) References Cited

U.S. PATENT DOCUMENTS

| | | | |
|---|---|---|---|
| 2012/0262173 A1* | 10/2012 | Soutome | G01R 33/3453 |
| | | | 324/309 |
| 2013/0119991 A1* | 5/2013 | Soutome | A61B 5/055 |
| | | | 324/322 |
| 2013/0300418 A1 | 11/2013 | Eberler | |
| 2013/0314091 A1* | 11/2013 | Otake | G01R 33/3657 |
| | | | 324/322 |
| 2014/0145722 A1 | 5/2014 | Suzuki | |
| 2015/0054506 A1 | 2/2015 | Eberler et al. | |

FOREIGN PATENT DOCUMENTS

| | | |
|---|---|---|
| CN | 101169473 A | 4/2008 |
| CN | 101529266 A | 9/2009 |
| CN | 101726714 A | 6/2010 |
| CN | 103389480 A | 11/2013 |
| CN | 103764023 A | 4/2014 |
| CN | 104422911 A | 3/2015 |
| CN | 204575834 U | 8/2015 |
| CN | 106980097 A | 7/2017 |

OTHER PUBLICATIONS

Chinese Office Action for Chinese Application No. 201811067483.1 dated Sep. 21, 2020, with English translation.
Zhang Jie, et al: "A Low-pass Birdcage Coil for low-field Magnetic Resonance Imaging", in: Collection of abstracts of the 16th National Conference on Spectroscopy, Nov. 24, 2010—abstract.

* cited by examiner

TUNABLE MAGNETIC RESONANCE COIL

This application claims the benefit of DE 102017216307.0, filed on Sep. 14, 2017, which is hereby incorporated by reference in its entirety.

BACKGROUND

The present embodiments relate to a magnetic resonance coil having at least one tuning device for tuning the magnetic resonance coil, a magnetic resonance device, and a method for tuning a magnetic resonance coil.

Based on the physical phenomenon of magnetic resonance (MR), magnetic resonance imaging (MRI) is a well-known technique for producing magnetic resonance images of a patient. For this purpose, during an MRI scan, excitation pulses are applied to the patient using a magnetic resonance coil (e.g., a body coil) to trigger magnetic resonance signals. The magnetic resonance signals triggered are received using the same and/or one or more other magnetic resonance coils (e.g., local coils). Magnetic resonance coils are described in the publications US 20150054506 A1, US 20150054506 A1, and U.S. Pat. No. 9,684,046 B2, for example.

A magnetic resonance coil may include an interlinking of capacitors and inductors that, in the case of a body coil, are usually disposed around a cylindrical supporting tube. After installation of a body coil in a magnetic resonance device, the actual electrical behavior of the body coil may be at variance with an ideal behavior, particularly with respect to the homogeneity of the capacitance distribution.

SUMMARY AND DESCRIPTION

The scope of the present invention is defined solely by the appended claims and is not affected to any degree by the statements within this summary.

The present embodiments may obviate one or more of the drawbacks or limitations in the related art. For example, a tuning device by which a better, more homogeneous capacitance distribution of the magnetic resonance coil may be obtained is provided.

A magnetic resonance coil having at least one tuning device for tuning the magnetic resonance coil is provided. Each of the at least one tuning devices includes a plurality of, for example, planar capacitors that are mechanically interlinked. For example, the plurality of capacitors have capacitances that may be collectively varied due to the mechanical linkage.

As a plurality of variable capacitors are available, the magnetic resonance coil may be tuned more selectively. This enables, for example, more homogeneous capacitance distributions of the magnetic resonance coil to be achieved.

Each of the at least one tuning devices includes a first layer having a plurality of first electrodes and a second layer having a plurality of second electrodes. Each of the plurality of capacitors includes at least one electrode of the plurality of first electrodes and at least one electrode of the plurality of second electrodes. The first layer and the second layer may be displaced relative to one another. For example, the second layer may be displaced with respect to the first layer. The plurality of capacitors each have a capacitance that may be varied by a relative displacement of the first layer and the second layer (e.g., by displacing the second layer with respect to the first layer).

By disposing a plurality of electrodes on a common layer, the electrodes of a layer are mechanically linked, thereby, for example, providing a common mechanical behavior (e.g., displacement) of the electrodes of a layer. Thus, with a displacement of the layers with respect to one another, not only one but even a plurality of capacitors may be varied simultaneously.

The magnetic resonance coil may have at least one conductor section (e.g., at least one electrically conductive conductor section). The at least one conductor section may be, for example, a section of conductor track. The at least one conductor section may be part of an antenna for transmitting and/or receiving radiofrequency signals. The at least one conductor section may have at least one break that is bridged (e.g., capacitively coupled and/or connected) by at least one capacitor of the plurality of capacitors. For example, the at least one conductor section has a plurality of sub-sections that are separated from one another by the at least one break. In one embodiment, at least one electrode of the plurality of first electrodes is connected to a first sub-section of the plurality of sub-sections, and at least one electrode of the plurality of second electrodes is connected to another sub-section of the plurality of sub-sections. As a result, a parallel connection or series connection of the capacitors formed by the electrodes may be implemented. Due to the variable capacitances of the plurality of capacitors, the capacitance distribution of the magnetic resonance coil may be influenced in a simple manner.

A layer may be a laminar structure. A layer is, for example, a structure having an extent in one spatial direction (e.g., a direction of a normal perpendicular to the surface of the layer) that is significantly less than in the spatial directions perpendicular thereto. The layers may have surfaces that are flat or also curved.

The layers (e.g., the first layer and the second layer) may be used as substrates for the respective electrodes (e.g., for the plurality of first electrodes and for the plurality of second electrodes). The electrodes may be disposed at (e.g., on) the surfaces of the layers. The electrodes may also be laminar structures that conform to the shape of the layers on which the electrodes are disposed.

The electrodes may be electrically conductive. The electrodes may include electrically conductive material (e.g., metal such as copper) that is disposed in a laminar manner on the surfaces of the layers.

The first layer, and therefore, for example, the first electrodes, may be disposed opposite the second layer, and therefore, for example, opposite the second electrodes. For example, the normal of the surface of the first layer is oriented parallel to the normal of the surface of the second layer (e.g., the layers run parallel to one another).

In the case of a body coil, the first layer and the second layer may be curved according to the supporting tube of the magnetic resonance device. For example, the surfaces of the layers run parallel to a surface (e.g., to the inner surface) of the supporting tube. The layers may be disposed coaxially about a central axis (e.g., the longitudinal axis) of the supporting tube. For example, the layers are offset to one another in the radial direction (e.g., the layers are at different distances from the central axis).

The first layer and the second layer may be displaceable relative to one another in a direction perpendicular to the surface normal of first layer and/or of the second layer. For example, the second layer may be displaced with respect to the first layer in a direction perpendicular to the normal of the surface of the second layer. For such a lateral displacement, the distance between the first layer and the second layer may remain constant. This embodiment allows a particularly flat and therefore space-saving design of the tuning device.

In one embodiment, the first layer and the second layer may be displaced relative to one another in a direction parallel to the normal of the surface of the first layer and/or of the second layer, so that a distance between the first layer and the second layer changes during a displacement.

In one embodiment, the relative displacement of the second layer with respect to the first layer may have both a lateral component and a perpendicular component.

For example, the plurality of capacitors are parallel-plate capacitors. The electrodes of the parallel-plate capacitors may be of flat or curved design. In simplified terms, the capacitance of a parallel-plate capacitor may be expressed by the following relation: $C \propto \varepsilon_r \, A/d$, where $\varepsilon_r$ is the relative permittivity, A is the overlapping area, and d is the distance between the electrodes (e.g., between the at least one first electrode and the at least one second electrode). The distance d may be between 0.01 and 5 mm or between 0.05 and 1 mm. The area A may be between 1 and 100 cm$^2$ or between 3 and 30 cm$^2$. The relative permittivity $\varepsilon_r$ (i.e., the dielectric constant) is a property of the medium (e.g., of the dielectric) between the electrodes. In one embodiment, a solid dielectric is used (e.g., FR4, Teflon, ceramic, plastic foil and/or commercial circuit board material). This enables a high dielectric strength to be achieved and a defined distance d to be provided. The relative lateral displacement of the layers thus enables, for example, the overlapping area A and therefore the capacitance C to be varied. In one embodiment, the distance d may be varied by a perpendicular displacement, thereby likewise enabling the capacitance to be varied.

According to another embodiment of the magnetic resonance coil, when the layers are displaced relative to one another, all the capacitors are varied by an identical capacitance value. However, in one embodiment, the capacitors may be varied by different capacitance values.

In one embodiment, at least some electrodes of the plurality of first electrodes and/or the plurality of second electrodes have a shape with an extent that changes perpendicular to the direction of the displacement. For example, a nonlinear relation between a displacement path of a layer and the capacitance of the capacitor may therefore also be provided.

In one embodiment, the magnetic resonance coil has more than two layers. Thus, the at least one tuning device may include, for example, at least one additional layer (e.g., a third layer) having at least one additional electrode (e.g., at least one third electrode in each case). The at least one additional electrode (e.g., the at least one third electrode) together with at least one electrode of the plurality of first electrodes and/or at least one electrode of the plurality of second electrodes form part of at least one additional capacitor. The at least one additional layer (e.g., the third layer) may be displaceable relative to the first layer and/or to the second layer. The at least one additional capacitor may have a capacitance that may be varied by a relative displacement of the third layer with respect to the first layer and/or the second layer.

The use of a plurality of layers enables the capacitance distribution of the magnetic resonance coil to be adjusted in an even more versatile manner.

The layers (e.g., the second layer and the third layer) may be displaceable in different directions. For example, the different directions are perpendicular to one another.

According to an embodiment, the magnetic resonance coil is a body coil that may be configured to be built into a magnetic resonance device (e.g., in contrast to local coils that are mostly re-positioned for each individual examination.) Thus, for example, an imperfect geometrical shape of the supporting tube may be compensated. For example, after installation of the supporting tube in a magnetic resonance device, fine tuning, which may be carried out using the proposed tuning device, may be provided.

The magnetic resonance coil may include a supporting tube having a surface (e.g., an inner surface), where the first layer and/or the second layer are displaced parallel to the surface (e.g., the inner surface) of the supporting tube. This allows particularly space-saving integration of the tuning device in the body coil.

The magnetic resonance coil may be a birdcage coil. Birdcage coils may have a plurality of antenna rods by which two end rings are interconnected (e.g., in a spoke-like manner). The plurality of antenna rods may be disposed in a distributed manner in a circumferential direction about a central axis. Birdcage coils are commonly used in local coils, but particularly also in body coils.

An embodiment of the magnetic resonance coil provides that the magnetic resonance coil has at least one conductor section that runs about a central axis in a circumferential direction, where the at least one conductor section has at least one break that is bridged by at least one capacitor of the plurality of capacitors. For example, the break subdivides the at least one conductor section into two sub-sections that are interconnected (e.g., electrically) via at least one capacitor of the plurality of capacitors. The at least one conductor section is an end ring of a birdcage coil. For example, each end ring of the birdcage coil may have one or more tuning devices.

The end ring may include one or more variable capacitors (e.g., parallel-plate capacitors) that are equipped with one or more collectively movable electrodes parallel to the central axis and/or collectively movable electrodes in the circumferential direction.

The second layer may be displaceable about the central axis in the circumferential direction and/or parallel to the central axis. This, for example, enables the tuning device to be incorporated in the magnetic resonance coil in a particularly simple and space-saving manner.

According to an embodiment of the magnetic resonance coil, the tuning device has a third layer with at least one third electrode. The plurality of first electrodes together with the at least one third electrode form part of at least one additional capacitor. The third layer may be displaceable parallel to the central axis and/or in the circumferential direction with respect to the first layer. The at least one additional capacitor has a capacitance that may be varied by displacement of the third layer with respect to the first layer. The use of three layers, for example, enables an even higher adjustment accuracy of the capacitance to be achieved.

Another embodiment of the magnetic resonance coil provides that the plurality of first electrodes are disposed one after the other in the circumferential direction and/or parallel to the central axis, and/or the plurality of second electrodes are disposed one after the other in the circumferential direction and/or parallel to the central axis. The plurality of first electrodes and the plurality of second electrodes may be disposed one after the other in the circumferential direction. For example, the electrodes may therefore be disposed in a distributed manner over the circumference.

For example, the electrodes of a layer have a spacing (e.g., an inner width). The distance between the electrodes may be constant or vary from electrode to electrode. For example, different adjustment mechanisms may be implemented thereby.

Another embodiment of the magnetic resonance coil provides that the at least one conductor section is divided into a plurality of segments in the circumferential direction, where a tuning device is disposed in each of the segments.

At these breaks, a capacitance may therefore be varied, for example, by displacement of at least one layer. By such an adjustment option being provided in each segment, any geometrical out-of-roundness of the conductor section, for example, may be compensated.

The number of segments may be between 2 and 6 (e.g., between 2 and 5; or 4). Such a number enables tuning to be carried out particularly efficiently.

In one embodiment, the tuning device may extend over the entire circumference of the at least one conductor section (e.g., of an end ring of a birdcage coil). This would enable, for example, the resonant frequency of the birdcage coil to be adjusted.

In a further development of the magnetic resonance coil, at least some electrodes of the plurality of first electrodes and/or the plurality of second electrode have a shape with an extent parallel to the central axis that varies in the circumferential direction and/or with an extent in the circumferential direction that varies parallel to the central axis. For example, the overlap of the electrodes of the different layers, and therefore the capacitance of the capacitors, may be adjusted even more selectively thereby.

Another embodiment provides that the first layer and/or the second layer has toothing. The tuning device includes a toothed wheel having teeth that engage in the toothing of the first layer and/or second layer.

Rotation of the toothed wheel causes the first layer and/or second layer to be displaced. This provides, for example, a simple displacement mechanism.

The tuning device may include a rod that is disposed (e.g., centrally) on the toothed wheel so that rotation of the rod causes the toothed wheel to rotate.

For example, one end of the rod is disposed on the toothed wheel. By applying force to the other end of the rod, the rod and the thereto connected toothed wheel may be caused to rotate. The force applied may be transmitted via the teeth of the toothed wheel to the second layer causing the second layer to be displaced.

A magnetic resonance device having a magnetic resonance coil as described above is also provided. For example, a magnetic resonance device in which the magnetic resonance coil is a body coil is provided. The magnetic resonance coil includes a rod, as described above. One end of the rod is disposed on one end of the supporting tube so that the relative displacement of the layers (e.g., the displacement of the second layer) may be initiated from outside the supporting tube. The rod may be aligned parallel to the central axis in order, for example, to enable force to be transmitted to the second layer in a particularly effective manner.

Also provided is a method for tuning a magnetic resonance coil. The magnetic resonance coil has a plurality of mechanically interlinked capacitors with capacitances that are varied simultaneously.

The advantages and features of the above described magnetic resonance coil apply equally to the proposed method, and vice versa.

The method may be used, for example, for matching a body coil to an imperfectly round RF shield of a gradient coil unit (e.g., during commissioning or repairs, exchanging a replacement part). For example, a resonant frequency and/or a decoupling of the body coil from the RF shield of the gradient coil unit may be adjusted thereby by simultaneously displacing the capacitance of a plurality of capacitors all at once by actuating a single final control element.

Another aspect of the method provides that the magnetic resonance coil is a birdcage coil having an end ring that is subdivided into a plurality of segments in the circumferential direction. The capacitors of a segment are mechanically interlinked, where the magnetic resonance coil is tuned according to the segments.

The capacitors may be mechanically coupled for either one half, one third, a quarter, or any other subdivision of the circumference of the end ring. The possibility of varying the capacitances segment by segment provides that a balance may be achieved without getting locally excessive capacitance values. For example, a more homogeneous capacitance distribution in the end rings may be achieved. As a result, the resonant frequency of the magnetic resonance coil may be freely adjusted more simply while retaining good decoupling of any feed ports.

BRIEF DESCRIPTION OF THE DRAWINGS

Mutually corresponding parts are provided with the same reference characters in all the figures.

DETAILED DESCRIPTION

Figure 1:
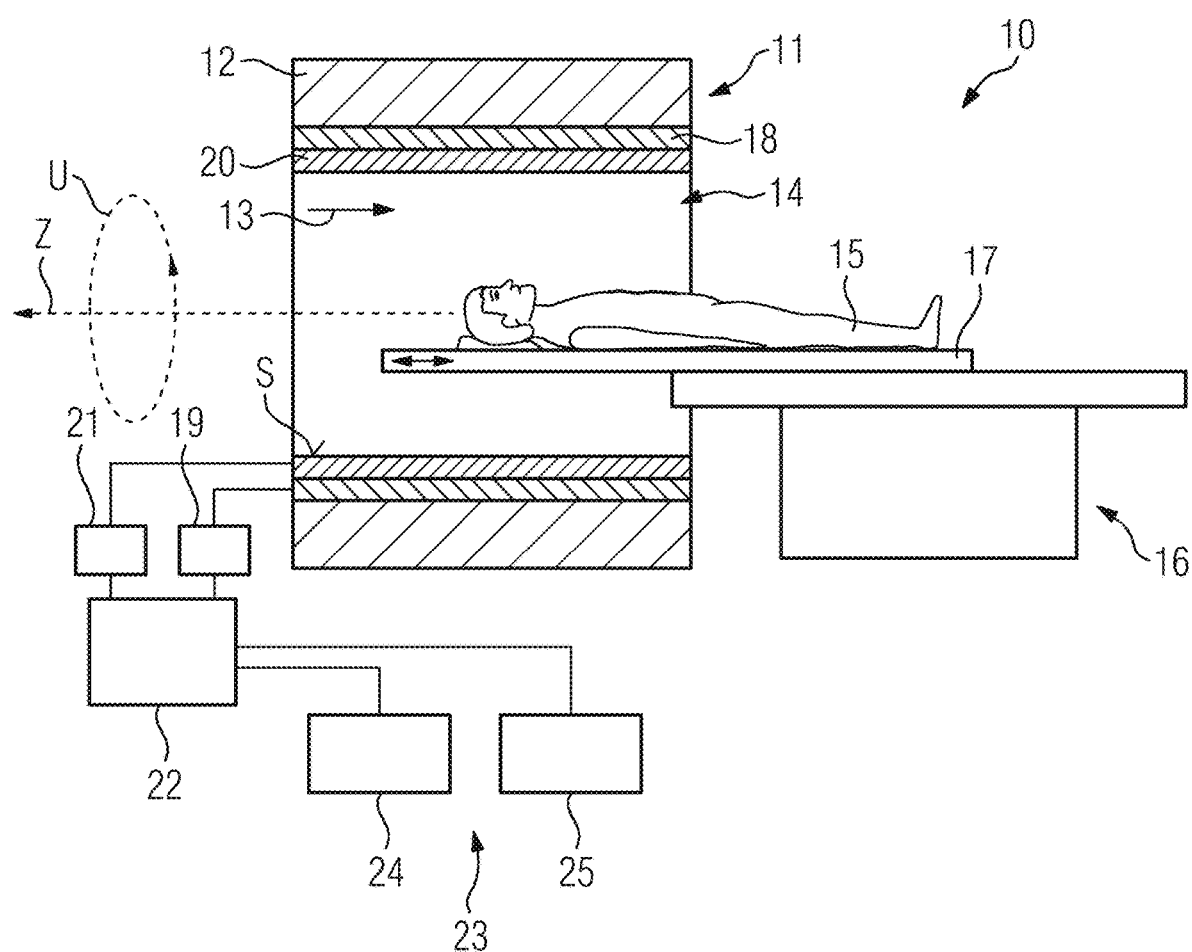
FIG. 1 schematically illustrates one embodiment of a magnetic resonance device having a body coil as a magnetic resonance coil.

FIG. 1 shows one embodiment of a magnetic resonance device 10 in schematic form. The magnetic resonance device 10 includes a magnet unit 11 that has a main magnet 12 for producing a powerful main magnetic field 13 that is, for example, constant over time. The magnetic resonance device 10 also includes a patient accommodation area 14 for accommodating a patient 15. In this exemplary embodiment, the patient accommodation area 14 is implemented cylindrically about a central axis and enclosed cylindrically in a circumferential direction by the magnet unit 11. However, a different design of the patient accommodation area 14 may be provided. The patient 15 may be slid into the patient accommodation area 14 by a patient positioning device 16 of the magnetic resonance device 10. For this purpose, the patient positioning device 16 has a patient table 17 configured to be moved inside the patient accommodation area 14.

The magnet unit 11 also has a gradient coil unit 18 for generating magnetic field gradients that are used for position encoding during imaging. The gradient coil unit 18 is controlled by a gradient control unit 19 of the magnetic resonance device 10. The magnet unit 11 also includes a magnetic resonance coil (e.g., in the form of a body coil 20 that is built into the magnetic resonance device 10). The body coil 20 is configured to excite atomic nuclei arising in the main magnetic field 13 generated by the main magnet 12. The body coil 20 is controlled by an RF control unit 21 of the magnetic resonance device 10 and injects radiofrequency magnetic resonance sequences into a scanning chamber that is essentially constituted by a patient accommodation area 14 of the magnetic resonance device 10. The body coil 20 includes a supporting tube having an inner surface S and delimiting the patient accommodation area 14 apart from any linings of the body coil 20. The body coil 20 is also configured to receive magnetic resonance signals.

For controlling the main magnet 12, the gradient control unit 19, and the RF control unit 21, the magnetic resonance device 10 has a system control unit 22. The system control unit 22 controls the magnetic resonance device 10 centrally, such as, for example, carrying out a predefined imaging gradient echo sequence. The system control unit 22 also includes a processor unit (not shown in greater detail) for analyzing medical image data obtained during the MRI scan. In addition, the magnetic resonance device 10 includes a user interface 23 that is connected to the system control unit 22. Control information such as imaging parameters, for example, as well as reconstructed magnetic resonance images may be displayed for medical operating personnel on a display unit 24 (e.g., on at least one monitor) of the user interface 23. The user interface 23 also has an input unit 25 by which information and/or parameters may be entered by medical operating personnel during a scan.

Figure 2:
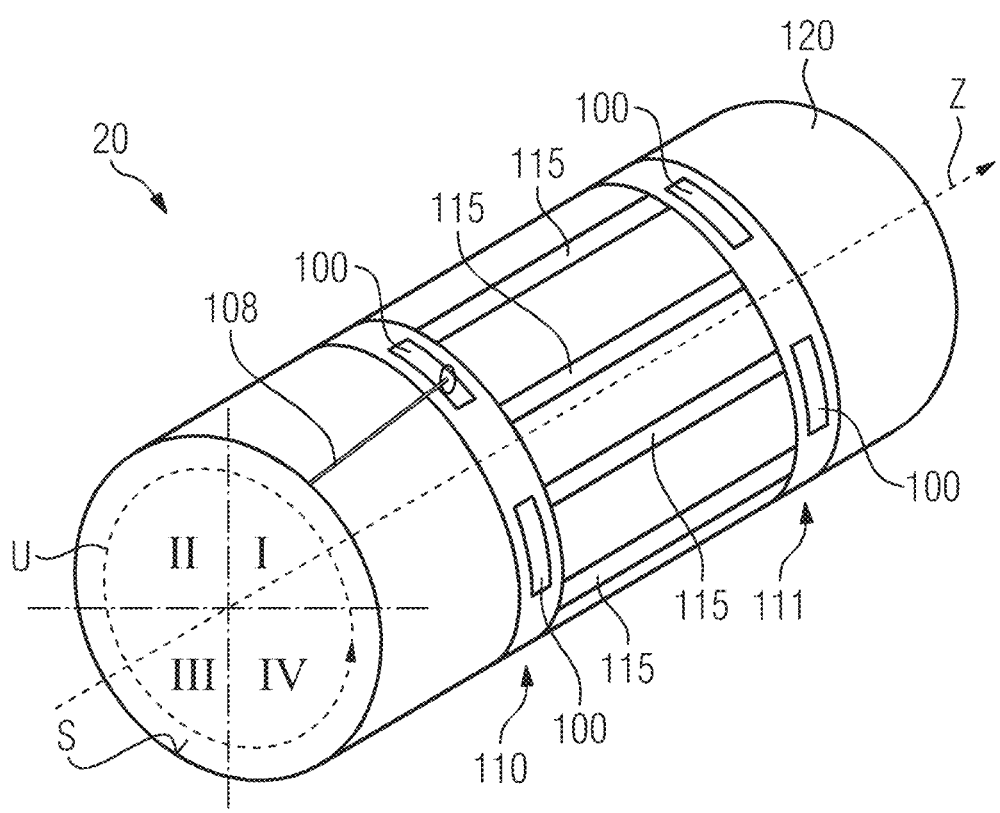
FIG. 2 shows a perspective detailed view of an example of a magnetic resonance coil having tuning devices distributed in a segmented manner.

In FIG. 2, the magnetic resonance coil is shown in detail by way of example as a body coil 20. The body coil 20 has, for example, the shape of a birdcage coil. The body coil 20 is disposed on a supporting tube 20. The body coil 20 includes two conductor sections 110, 111 running around a central axis Z in a circumferential direction U. The two conductor sections 110, 111 are in this case end rings of the birdcage coil.

The two conductor sections 110, 111 are interconnected by antenna rods 115. The body coil 20 also includes tuning devices 100 having capacitors by which the body coil 20 may be tuned.

The conductor sections 110, 111 are subdivided into four segments I, II, III, IV in the circumferential direction U, where a tuning device 100 is disposed within each of the segments I, II, III, IV of the at least one conductor section 110, 111. However, in one embodiment, a single tuning device extends over the entire circumference of an end ring.

Figure 3:
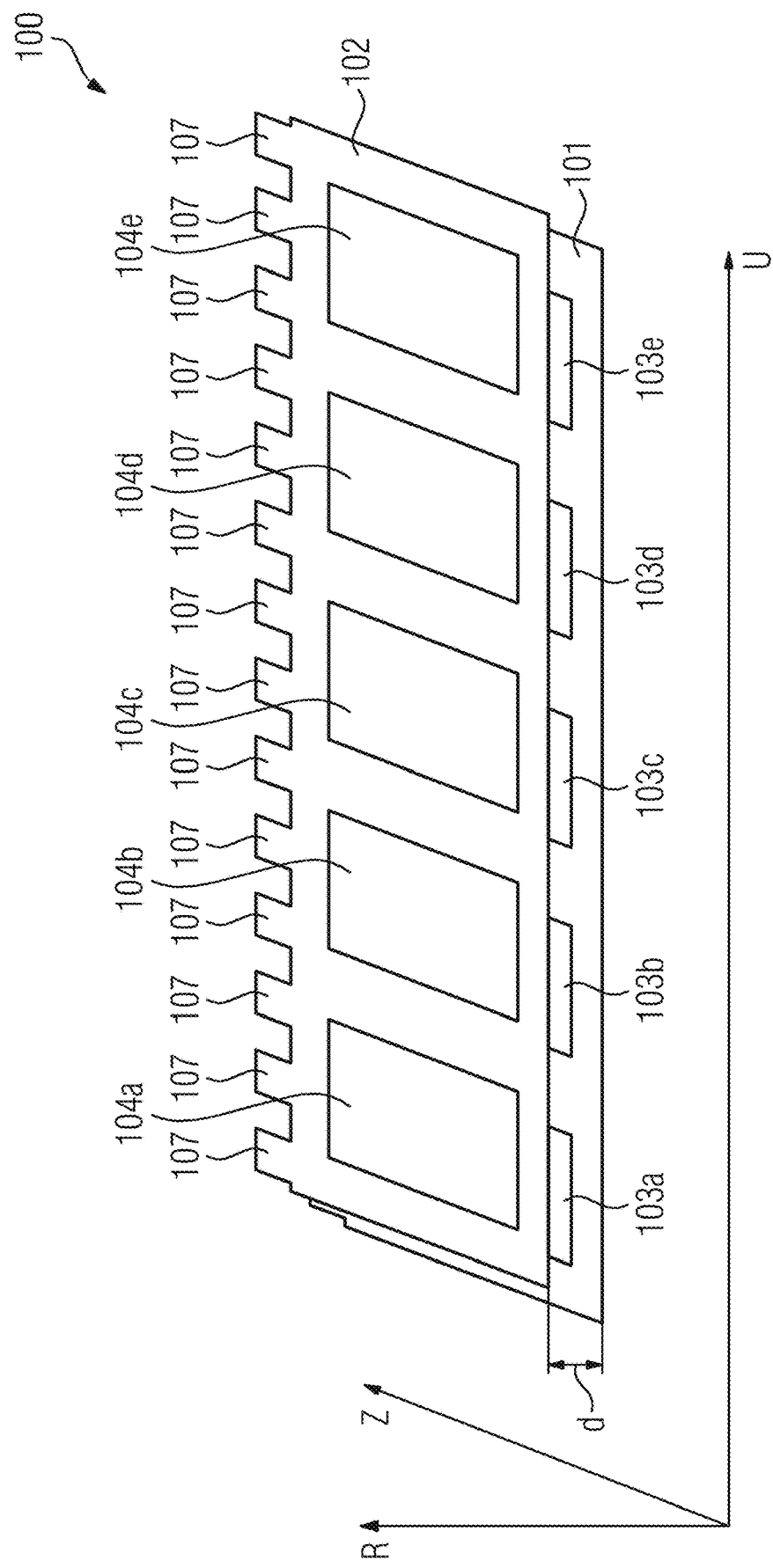
FIG. 3 shows two layers having a plurality of electrodes of a tuning device.

FIG. 3 shows a perspective view of one embodiment of a tuning device 100. The tuning device 100 includes a first layer 101 having a plurality of electrodes 103a, 103b, 103c, 103d, 103e, and a second layer 102 having a plurality of electrodes 104a, 104b, 104c, 104d, 104e. The first layer 101 and the second layer 102 are disposed parallel to one another. In addition, the first layer 101 is disposed in an offset manner with respect to the second layer 102 in a, for example, radial direction R. The direction R is perpendicular to the circumferential direction U and to the direction of the central axis Z. The plurality of first electrodes 103a, 103b, 103c, 103d, 103e and the plurality of second electrodes 104a, 104b, 104c, 104d, 104e are, for example, disposed one after the other in the circumferential direction U.

The plurality of electrodes 103a, 103b, 103c, 103d, 103e together with the plurality of electrodes 104a, 104b, 104c, 104d, 104e form part of a plurality of capacitors having the capacitances $C_a$, $C_b$, $C_c$, $C_d$, $C_e$ that may be varied by displacement of the second layer 102 with respect to the first layer 101.

Figure 4:
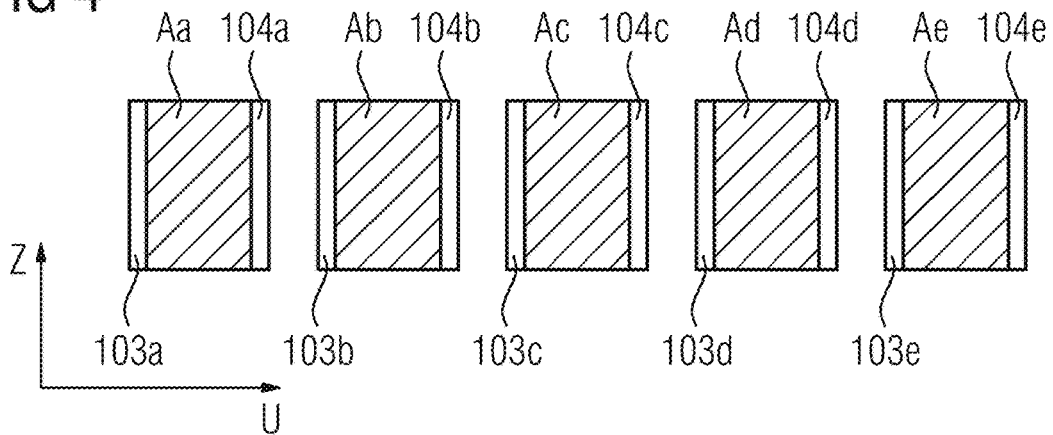
FIGS. 4-6 show different exemplary electrode overlaps depending on displacement of the layers.
Figure 5:
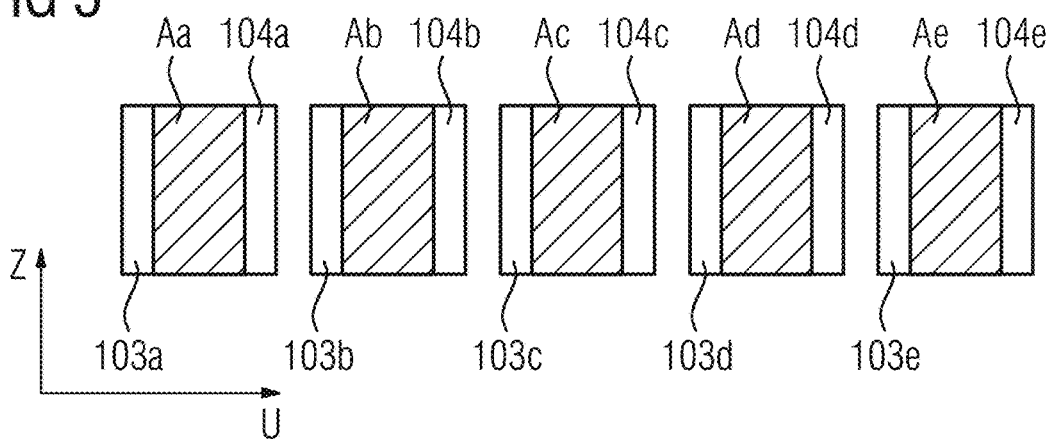
Figure 6:
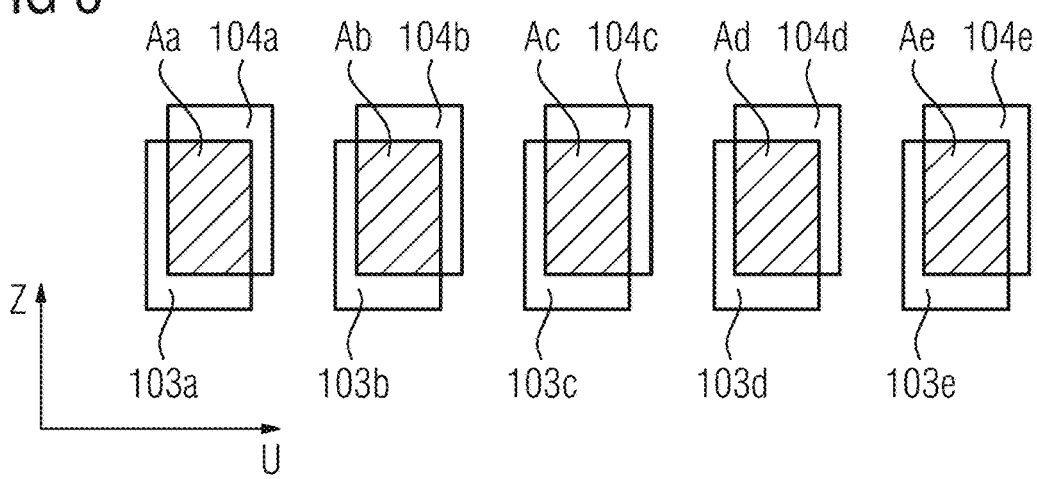

For a parallel-plate capacitor, the following relation applies: $C \propto A/d$, where A is the overlapping area and d is the distance between the electrodes 103a, 103b, 103c, 103d, 103e, 104a, 104b, 104c, 104d, 104e. By displacement of the second layer 102 with respect to the first layer 101 (e.g., in a direction perpendicular to the surface normal of the second layer 102), the overlapping area A may be varied, as shown in FIGS. 4-6. As compared to the state in FIG. 4, the electrodes 104a, 104b, 104c, 104d, 104e of the second layer 102 are displaced in the circumferential direction U in FIG. 5 and parallel to the central axis Z in FIG. 6. This causes the overlapping areas Aa, Ab, Ac, Ad, Ae and therefore also the capacitances Ca, Cb, Cd, Ce, Ce to change. A combination of displacement in the circumferential direction U and parallel to the central axis Z may also be provided. With respect to the exemplary embodiment shown in FIG. 2, the second layer 102 may be displaced, for example, parallel to the inner surface S of the supporting tube 120.

Due to the fact that not just one but a plurality of electrodes are disposed on at least one layer, a plurality of capacitances may be simultaneously varied by the displacement of the first layer 101 and the second layer 102 with respect to one another.

Figure 7:
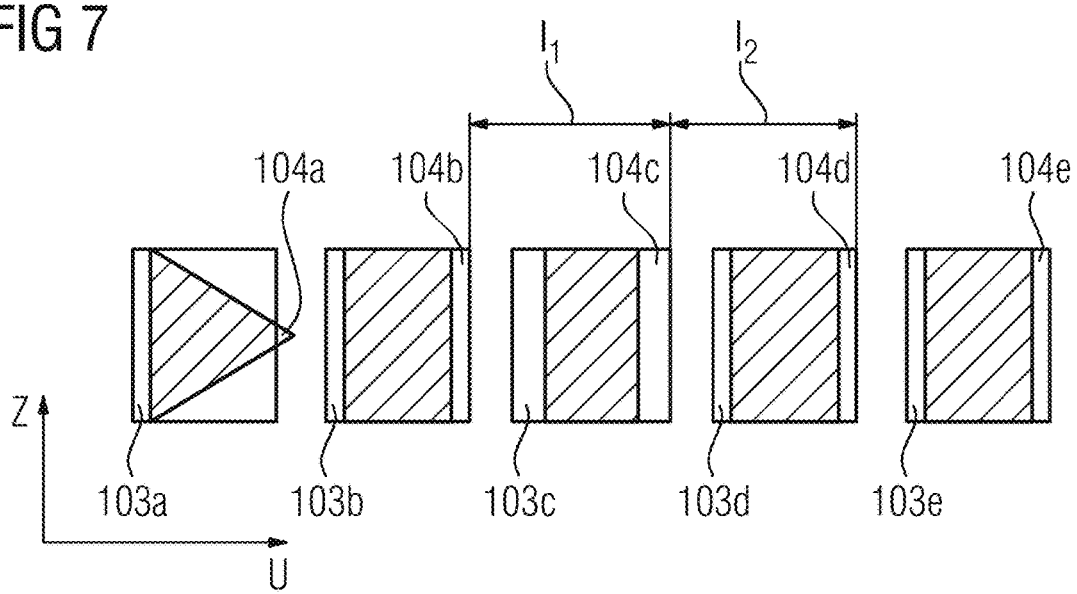
FIG. 7 shows different shapes and arrangements of the electrodes.

Yet more embodiments of the electrodes may be provided, as shown by way of example in FIG. 7. Thus, the triangular electrode 104a has a shape having an extent that varies perpendicular to the direction of the displacement. For example, an extent parallel to the central axis Z varies in the circumferential direction U and an extent in the circumferential direction U varies parallel to the central axis Z.

In addition, the electrodes may be spaced different distances apart. Thus, for example, the distance 11 between the electrode 104b and the electrode 104c is greater than the distance 12 between the electrode 104c and the electrode 104d.

Figure 8:
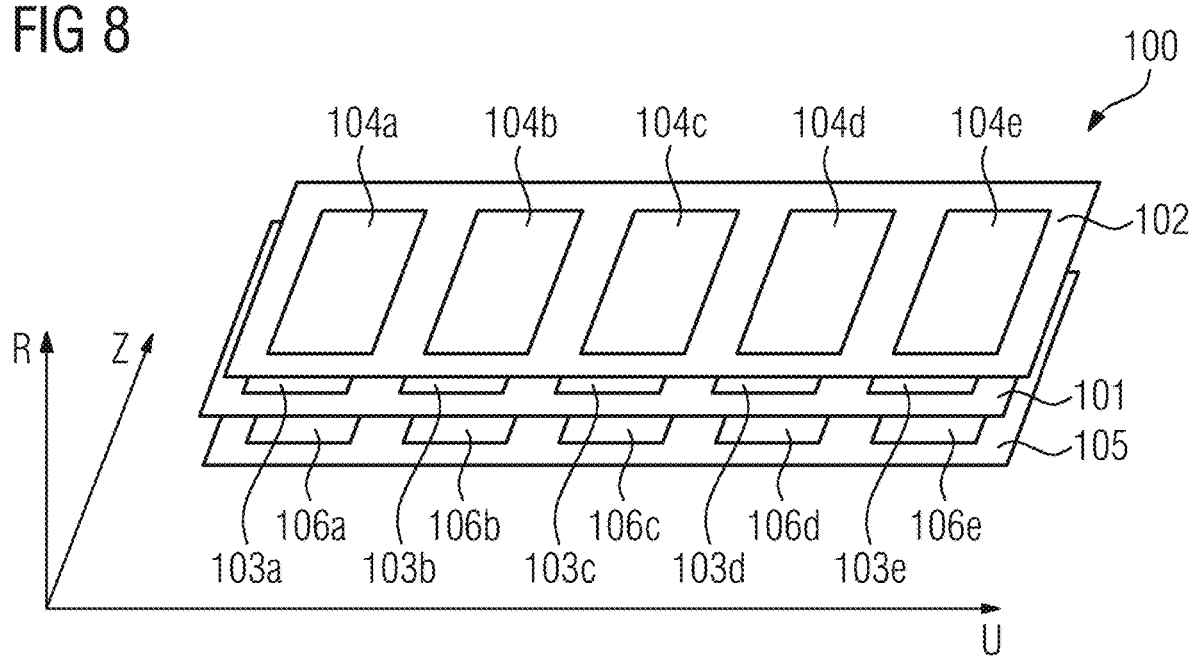
FIG. 8 shows an embodiment of a tuning device having three layers.

In the exemplary embodiment shown in FIG. 8, the concept of the present embodiments is extended to more than two layers. The tuning device includes, for example, a third layer 105 having a plurality of third electrodes 106a, 106b, 107c, 108d, 108e. The plurality of third electrodes 106a, 106b, 107c, 108d, 108e together with the plurality of first electrodes 103a, 103b, 103c, 103d, 103e form part of a plurality of additional capacitors. The capacitances of the additional capacitors may be varied by displacing the third layer 105 with respect to the first layer 101.

For example, the second layer 102 and the third layer 105 may be displaced in different directions. For example, the third layer 105 may be displaced parallel to the central axis Z, and the second layer 102 may be displaced in the circumferential direction U.

The second layer 102, which is shown in FIG. 3, includes a toothing 107. The tuning device 100 includes a toothed wheel (not shown in more detail here) with teeth that engage in the toothing 107 of the second layer 102. Rotation of the toothed wheel enables the second layer 102 to be displaced in the circumferential direction U.

The tuning device 100 in FIG. 2 also includes a rod 108 that is disposed on the toothed wheel, where one end of the rod 108 is disposed on one end of the supporting tube 120. As a result, the toothed wheel may be rotated in the magnetic resonance device 10 even in the built-in state of the body coil 20.

The magnetic resonance coil and magnetic resonance device described in detail above are only examples that may be modified in different ways by persons skilled in the art without departing from the scope of the invention.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

While the present invention has been described above by reference to various embodiments, it may be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. A magnetic resonance coil comprising:
   at least one tuning device configured to tune the magnetic resonance coil, wherein each tuning device of the at least one tuning device comprises capacitors that are mechanically interlinked, wherein each tuning device of the at least one tuning device further comprises:
      a first layer spaced apart from a central axis of the magnetic resonance coil in a radial direction, the first layer being a first laminar structure having a surface normal perpendicular to the central axis, the first layer having a plurality of first electrodes; and
      a second layer offset from the first layer in the radial direction, the second layer being a second laminar structure having a surface normal perpendicular to the central axis, such that the second layer is disposed adjacent and parallel to the first layer, the second layer having a plurality of second electrodes.

2. The magnetic resonance coil of claim 1, wherein the magnetic resonance coil is a body coil configured to be built into a magnetic resonance device.

3. The magnetic resonance coil of claim 1, wherein the magnetic resonance coil is a birdcage coil.

4. The magnetic resonance coil of claim 1, wherein the first layer and the second layer are displaceable relative to one another in a direction perpendicular to the surface normal of the first layer, the second layer, or the first layer and the second layer.

5. The magnetic resonance coil of claim 1, wherein the magnetic resonance coil is a body coil configured to be built into a magnetic resonance device,
   wherein the magnetic resonance coil comprises a supporting tube having a surface, and
   wherein the first layer, the second layer, or the first layer and the second layer are displaceable parallel to the surface of the supporting tube.

6. The magnetic resonance coil of claim 1, further comprising at least one conductor section that runs around the central axis in a circumferential direction,
   wherein the at least one conductor section has at least one break that is bridged by the capacitors.

7. The magnetic resonance coil of claim 6, wherein the at least one conductor section comprises at least one end ring of a birdcage coil.

8. The magnetic resonance coil of claim 1,
   wherein each of the capacitors comprises at least one first electrode of the plurality of first electrodes and at least one second electrode of the plurality of second electrodes,
   wherein the first layer and the second layer are displaceable relative to one another, and
   wherein each of the capacitors has a capacitance that is variable by relative displacement of the first layer and the second layer.

9. The magnetic resonance coil of claim 8, wherein at least some electrodes of the plurality of first electrodes, the plurality of second electrodes, or the plurality of first electrodes and the plurality of second electrodes have a shape having an extent that varies perpendicular to a direction of the displacement.

10. The magnetic resonance coil of claim 8, wherein one or more turning devices of the at least one tuning device comprise at least one third layer having at least one third electrode in each case,
    wherein the at least one third electrode together with the plurality of first electrodes, the plurality of second electrodes, or the plurality of first electrodes and the plurality of second electrodes form part of at least one additional capacitor,
    wherein the third layer is displaceable relative to the first layer, the second layer, or the first layer and the second layer, and
    wherein the at least one additional capacitor has a capacitance that is variable by displacement of the third layer relative to the first layer, the second layer, or the first layer and the second layer.

11. The magnetic resonance coil of claim 10, wherein the first layer, the second layer, the third layer, or any combination thereof is displaceable in different directions.

12. The magnetic resonance coil of claim 1, wherein the magnetic resonance coil has at least one conductor section that runs around the central axis in a circumferential direction,
    wherein the at least one conductor section has at least one break that is bridged by the capacitors, and
    wherein the second layer is displaceable about the central axis in the circumferential direction, parallel to the central axis, or about the central axis in the circumferential direction and parallel to the central axis.

13. The magnetic resonance coil of claim 12, wherein the at least one conductor section is at least one end ring of a birdcage coil.

14. The magnetic resonance coil of claim 12, wherein one or more tuning devices of the at least one tuning device has a third layer having at least one third electrode,
    wherein the plurality of first electrodes together with the at least one third electrode form part of at least one additional capacitor,
    wherein the third layer is displaceable with respect to the first layer parallel to the central axis in a circumferential direction, and
    wherein the at least one additional capacitor has a capacitance that is variable by displacement of the third layer with respect to the first layer.

15. The magnetic resonance coil of claim 12, wherein the plurality of first electrodes are disposed one after another in a circumferential direction, parallel to the central axis, or in the circumferential direction and parallel to the central axis, the plurality of second electrodes are disposed one after another in the circumferential direction, parallel to the central axis, or in the circumferential direction and parallel to the central axis.

16. The magnetic resonance coil of claim 12, wherein the at least one conductor section is subdivided into a plurality of segments in the circumferential direction, and
    wherein a tuning device is disposed in each segment of the plurality of segments.

17. The magnetic resonance coil of claim 12, wherein at least some electrodes of the plurality of first electrodes, the plurality of second electrodes, or the plurality of first electrodes and the plurality of second electrodes have a shape having an extent parallel to the central axis that varies in the circumferential direction, having an extent in the circumferential direction that varies parallel to the central axis, or having an extent parallel to the central axis that varies in the circumferential direction and having an extent in the circumferential direction that varies parallel to the central axis.

18. The magnetic resonance coil of claim 1, wherein the first layer, the second layer, or the first layer and the second layer comprise a toothing, and
wherein the at least one tuning device comprises a toothed wheel having teeth that engage in the toothing of the first layer, the second layer, or the first layer and the second layer.

19. The magnetic resonance coil of claim 18, wherein the at least one tuning device comprises a rod that is disposed on the toothed wheel.

20. The magnetic resonance coil of claim 1, wherein the magnetic resonance coil comprises a supporting tube having an inner surface disposed cylindrically about the central axis of the magnetic resonance coil, such that a circumference of the inner surface defines a patient accommodation area, and
wherein a surface of the first layer, the second layer, or the first layer and the second layer are displaced parallel to the inner surface of the supporting tube and extend around the circumference of the inner surface, such that the first layer, the second layer, or the first layer and the second layer are cylindrically shaped.

21. The magnetic resonance coil of claim 20, wherein the first layer and the second layer are displaceable relative to one another about the central axis in a circumferential direction, parallel to the central axis, or about the central axis in the circumferential direction and parallel to the central axis.

22. A magnetic resonance device comprising:
a magnetic resonance coil comprising:
at least one tuning device configured to tune the magnetic resonance coil, wherein each tuning device of the at least one tuning device comprises capacitors that are mechanically interlinked, wherein each tuning device of the at least one tuning device further comprises:
a first layer spaced apart from a central axis of the magnetic resonance coil in a radial direction, the first layer being a first laminar structure having a surface normal perpendicular to the central axis, the first layer having a plurality of first electrodes; and
a second layer offset from the first layer in the radial direction, the second layer being a second laminar structure having a surface normal perpendicular to the central axis, such that the second layer is disposed adjacent and parallel to the first layer, the second layer having a plurality of second electrodes.

23. The magnetic resonance device of claim 22, wherein the magnetic resonance coil further comprises a supporting tube,
wherein the at least one tuning device comprises a rod that is disposed on a toothed wheel, and
wherein one end of the rod is disposed on one end of the supporting tube.

24. A method for tuning a magnetic resonance coil, the magnetic resonance coil comprising at least one tuning device configured to tune the magnetic resonance coil, wherein each tuning device of the at least one tuning device comprises a first layer spaced apart from a central axis of the magnetic resonance coil in a radial direction, the first layer being a first laminar structure having a surface normal perpendicular to the central axis, the first layer having a plurality of first electrodes, and a second layer offset from the first layer in the radial direction, the second layer being a second laminar structure having a surface normal perpendicular to the central axis, such that the second layer is disposed adjacent and parallel to the first layer, the second layer having a plurality of second electrodes,
wherein each tuning device of the at least one tuning device further comprises capacitors that are mechanically interlinked, the method comprising:
varying capacitances of the mechanically interlinked capacitors of the magnetic resonance coil simultaneously.

25. The method of claim 24, wherein the magnetic resonance coil is a birdcage coil, wherein the birdcage coil has at least one end ring that is subdivided into a plurality of segments in a circumferential direction, and
wherein the magnetic resonance coil is tuned segment by segment according to the segments.

* * * * *